United States Patent [19]
Mori et al.
[11] 3,760,198
[45] Sept. 18, 1973

[54] CIRCUITRY FOR TRANSMITTING PULSES WITH GROUND ISOLATION BUT WITHOUT PULSE WAVEFORM DISTORTION

[75] Inventors: Hiroshi Mori; Yutaka Wakasa; Hisayuki Uchiike, all of Tokyo, Japan

[73] Assignee: Yokogawa Electric Works, Ltd., Tokyo, Japan

[22] Filed: Oct. 21, 1971

[21] Appl. No.: 191,176

[30] Foreign Application Priority Data

Nov. 6, 1970 Japan .............................. 45/97616

[52] U.S. Cl. ................ 307/268, 307/230, 307/263, 328/162, 328/164, 330/107
[51] Int. Cl. ......................... H03k 5/01, H03k 6/04
[58] Field of Search .................... 307/230, 263, 264, 307/268; 328/162, 164, 172, 173, 175; 330/107

[56] References Cited

UNITED STATES PATENTS

| | | | |
|---|---|---|---|
| 2,658,958 | 11/1953 | Wells | 328/162 UX |
| 3,402,304 | 9/1968 | Burke | 328/164 X |
| 3,304,508 | 2/1967 | Danielsen et al. | 328/173 X |

*Primary Examiner*—John Zazworsky
*Attorney*—Howard M. Bollinger et al.

[57] ABSTRACT

A ground isolation circuit, capable of transferring signal pulses from a source device to a succeeding device operating at a different ground potential, is characterized by a distortion free transfer of the pulse waveform. Signal pulses at the source device are applied to the input winding of a pulse transformer to cause pulses to be induced across an isolated output winding of the transformer. The induced pulses, containing waveform sag distortion due to transformer inductance, are applied to an operational amplifier which includes a resistive-capative negative feedback circuit having its impedance parameters valued in relation to the impedance parameters of the pulse transformer to compensate by means of feedback for the pulse waveform sag introduced by the pulse transformer.

The output of the operational amplifier is applied directly to the succeeding device or to a second isolation circuit adapted to eliminate distortion in pulses having a relatively long duration. In the second isolation circuit a pair of coincidence gates are each gated both by the output waveform of the operational amplifier and by an oscillator supplying opposite polarity clock pulses to the two gates, and thus the gate outputs are clock pulse trains of opposite polarity, occurring contemporaneously with the signal pulse. A second pulse transformer has its input winding connected to the gate outputs, to cause an alternating polarity waveform to be induced across an isolated output winding. This alternating waveform is rectified and applied to a switch to cause it to be "on" during the signal pulse. By selecting the clock pulse period to be short in relations to the signal pulse period, insignificant pulse waveform sag is introduced by the second pulse transformer, since each clock pulse restores the transformer output to its previous level, and the switch is accurately controlled.

19 Claims, 14 Drawing Figures

CIRCUITRY FOR TRANSMITTING PULSES WITH GROUND ISOLATION BUT WITHOUT PULSE WAVEFORM DISTORTION

BACKGROUND OF THE INVENTION

1. Field of the Invention

This invention relates to circuits designed to transfer pulses from one device to another with ground isolation in order to avoid instabilities caused by non-uniform grounding potentials. An example of the use of such circuits is found in computer process control. Monitoring devices generate pulse signals to provide data regarding the process. These pulse signals are to be transferred to the electronic computer, which processes the data. Frequently the monitoring device and the computer are grounded at points standing at different potentials. To permit stable operation to take place, some arrangement for ground isolation is employed.

2. Description of the Prior Art

It is known in the prior art to provide ground isolation by using a pulse transformer with isolated input and output windings. This arrangement, however, introduces distortion in the pulse waveform because the transformer has a finite inductance and resistance which introduce a decay or sag into the output waveform. This results because transformer secondary is energized by the leading edge of the pulse, and the stored energy decays exponentially to produce the sag as the input pulse maintains a constant value. As a result, the pulse is not faithfully transmitted with the risk that subsequent logic processing circuitry will malfunction. When amplifying the signal, the distortion remains. Particularly where a pulse has a long duration, the distortion introduced by the transformer can significantly affect the accuracy of the subsequent pulse processing.

SUMMARY OF THE INVENTION

Objects of the present invention are to provide a ground isolation circuit capable of eliminating distortions introduced by an isolating transformer so as to faithfully transfer the pulse wave form, capable of amplifying the pulse without distortion, and capable of eliminating distortion even when the pulse period is long.

The ground isolation circuit according to the invention transfers signal pulses from a source device to a succeeding device with control of pulse waveform distortion. A pulse transformer receives signal pulses from said source device on its input winding and induces across an isolated output winding pulse waveforms carrying distortion caused by the transformer inductance. A compensating circuit including a high gain amplifier means, such as an operational amplifier, is connected to receive the pulse waveforms induced in the output winding. The amplifier includes a capacitive negative feedback circuit which has its impedance parameters valued in relation to the impedance parameters of said pulse transformer, to selectively compensate by means of the feedback for pulse waveform sag introduced by the pulse transformer. The compensating circuit provides an output waveform without substantial distortion or with preselected distortions introduced for the purpose of precompensating other distortions in later circuit portions. The feedback circuit is preferably provided with means for adjusting its impedance parameters so that the degree of compensation can be easily selected.

According to another aspect of the invention there is an isolating circuit which may be connected in series with the compensating circuit described above. The isolating circuit comprises coincidence gate means being gated at one input thereof by the pulse signal. An oscillator supplies clock pulses at the other input of said gate means, whereby the output of said gate means is a train of clock pulses contemporaneous with said signal pulse. A pulse transformer has its input winding connected to the gate means so that said pulse train is applied thereto, and the isolated output winding of the transformer has a corresponding alternating signal induced thereacross. A switching circuit is maintained in a preselected state by said induced alternating signal. The output of said switching means thus is a pulse waveform which faithfully reproduces the input signal pulse. Because each clock pulse re-energizes the transformer output winding, output waveform sag is insignificant, the switching circuit is accurately controlled and the resulting output waveform is substantially distortion free even though the signal pulse has a long duration.

In further detail, the second isolation circuits employ a pair of coincidence gates each having said signal pulse at one input, and said oscillator supplies opposite polarity clock pulses to the other gate inputs, the transformer input winding being connected between the gate outputs. The switching circuit includes a rectifier to convert the induced alternating signal to a single polarity signal, and a switch such as a transistor is responsive to this single polarity signal to maintain its preselected state. In one embodiment, rectification is provided by diodes and the switch is a transistor; in another embodiment a pair of transistors provide the needed rectification through their base-emitter junction and simultaneously function as the switch.

Other objects, aspects and advantages of the invention will be pointed out in, or be apparent from, the detailed description hereinbelow, considered together with the following drawings.

DESCRIPTION OF THE PREFERRED EMBODIMENTS

Figure 1:
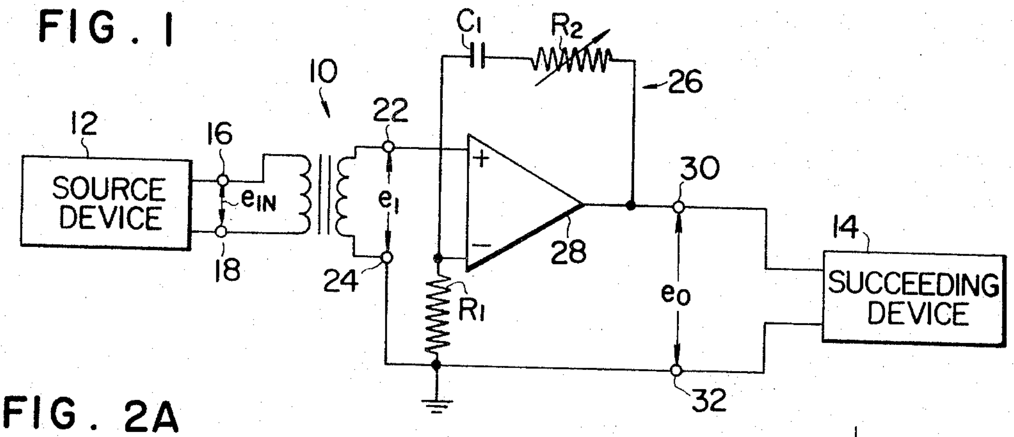
FIG. 1 is a schematic diagram of ground isolation circuitry according to the invention.

FIG. 1 illustrates a ground isolation circuit 10 according to the invention which is arranged to transfer signal pulses from a source device 12 to a succeeding device 14 with ground isolation and without introduction of waveform distortion. As explained previously, the source device 12 may be a process monitoring device generating pulses to provide data about the process, and the succeeding device 14 may be an electronic computer to process the data. Similarly, the ground isolation circuit 10 may be employed to transfer signal pulses from the computer back to a process control device.

Figure 2A:
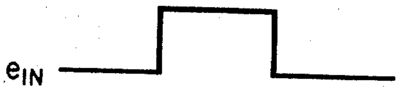
FIGS. 2A through 2D are illustrations of waveforms appearing in the circuit of FIG. 1.
Figure 2B:
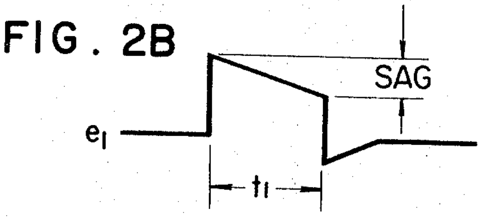

Signal pulses produced in source device 12 are applied to input terminals 16, 18 of the input winding of a pulse transformer 20. As a result of the input voltage $e_{in}$ shown in FIG. 2A and applied to terminals 16, 18, there is induced across output terminals 22, 24 of the isolated output winding of transformer 20 a pulse wave form $e_1$ as shown in FIG. 2B.

The induced voltage $e_1$ is applied to a compensating circuit 26 which comprises an operational amplifier 28 connecting its positive input terminal to one terminal 22 of the transformer 20 output winding, and its negative input terminal to the other output winding terminal 24 through ground resistor R1. A capacitive negative feedback circuit, comprising capacitor C1 and resistor R2 in series, is connected between the output terminal and negative input terminal of operational amplifier 28. The output $e_o$ of compensating circuit 26, developed between the operational amplifier 28 output terminal and ground at terminals 30, 32, is supplied to the succeeding device 14. As will be explained below, compensating circuit 26 permits distortion appearing in waveform $e_1$ to be substantially eliminated, or to be selectively controlled to provide over- or under-compensation.

The parameters of the impedances R1, R2, C1 determine the nature of the compensation provided by compensating circuit 26 as will be evident from the following analysis. When a pulse signal having a waveform as shown in FIG. 2A is applied to transformer 20, the output waveform $e_1$ (FIG. 2B) sags or decays due to the inductive impedance of the transformer. The energy stored by the leading edge of the pulse decays exponentially, and the output waveform voltage $e_1$ during the time the input voltage $e_{in}$ is constant can be expressed as $$e_1 = E_1 (e^{-t/T_1}) \qquad (1)$$

or, in terms of the Laplace transform, $$L(e_1) = E_1/(S+1/T_1) \qquad (2)$$

where $E_1$ is the initial amplitude of output waveform $e_1$, $T_1$ is the time constant associated with the inductive and resistive parameters of transformer 20, $e$ is the natural logarithmic base and S is the Laplacian variable.

The transfer function G(S) of compensating circuit 26 is given by equation 3 below when its amplification factor is infinite, a reasonable assumption in view of the amplification factors of 2,000 or more available with typical operational amplifiers.

$$G(S) = (R1 + R2)/R1 + 1/(C1R1)S$$

or, $$G(S) = A + 1/T2 \cdot S \qquad (3)$$

where $A = (R1 + R2)/R1$ and $T2 = R1C1$.

Because transformer 20 and compensating circuit 26 are connected in series to each other with respect to the input voltage $e_{in}$, the output voltage $e_0$ of compensating circuit 26 can be expressed as $$L(e_0) = G(S)L(e_1) = AE1/(S+1/T1) + E1/T2S(S+1/T1) \qquad (4)$$

By taking the inverse transformation of equation 4, the following expression for $e_0$ is obtained.

$$e_0 = AE1e^{-t/T1} + (T1/T2)\,E1\,(1-e^{-t/T1}) \qquad (5)$$

From equation 5 it is apparent that $e_0$ is a function not only of time but also of the impedance parameters (R1, R2, and C1.) It is further apparent that these impedance parameters can be selected so that $e_0$ is not dependant on time but remains constant. The output voltage $e_o$ is constant whenever $$C1 = T_1/(R1 + R2) \qquad (6)$$

Figure 2C:
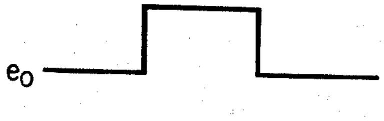

Accordingly, distortions in waveform $e_1$ caused by transformer 20 can be substantially eliminated by compensating circuit 26 to obtain an output waveform (FIG. 2C) which is substantially distortion free. In addition, the impedance parameters R1, R2, and C1 can be related to the impedance parameters of transformer 20 to provide selected over- or under-compensation.

Figure 2D:
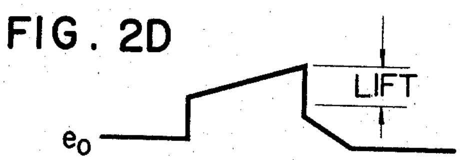

Overcompensation, as shown in FIG. 2D, results when $$C1 < T1\,(R1+R2) \qquad (7)$$

Similarly, the output wave form $e_0$ may be undercompensated for distortion, thereby retaining some of the sag shown in FIG. 2B, when $$C1 > T1\,(R1 + R2) \qquad (8)$$

In addition to providing compensation as described above, compensating circuit 26 additionally amplifies the pulse signal to increase its magnitude. For example, substituting the impedance condition of equation 6 into equation 5, it can be seen that $$e_0 = (1+R2/R1)E1 \qquad (9)$$

Figure 3:
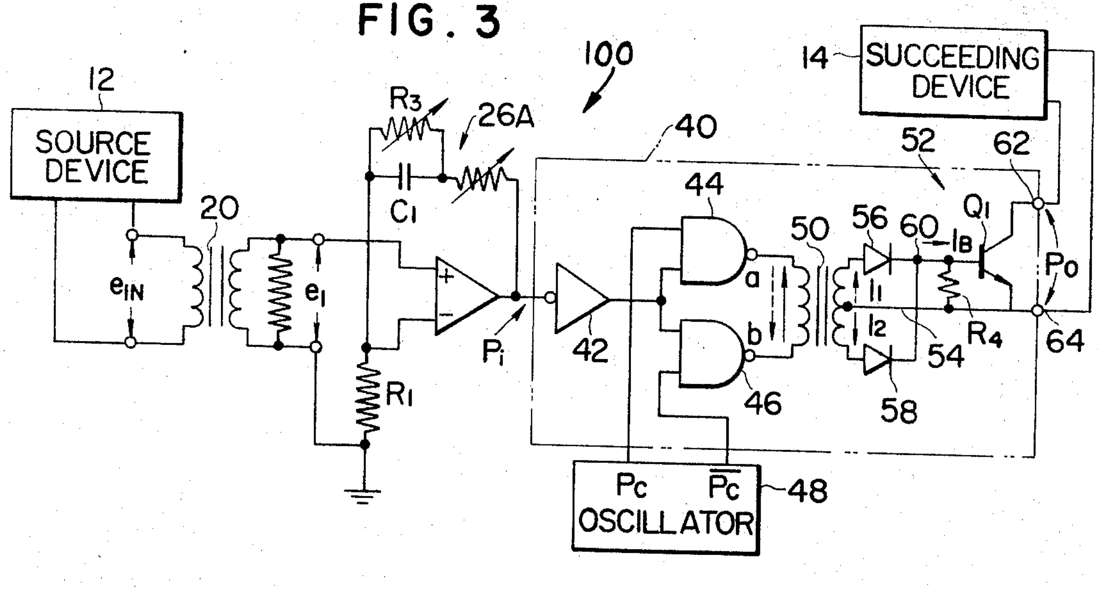
FIG. 3 is a schematic diagram of a modification of the invention.

FIG. 3 illustrates a modified ground isolation circuit 100 according to the invention in which pulse signals from source device 12 are applied to a pulse transformer 20 and to a compensating circuit 26A similar to the compensating circuit 26 of FIG. 1 but modified to include a resistor R3 connected in parallel with capacitor C1 so as to permit the effective capacitance of capacitor C1 to be adjusted to vary the degree of compensation provided by compensating circuit 26A. The output of compensating circuit 26A, instead of being applied directly to the succeeding device 14 as in FIG. 1, is applied first to an isolating circuit 40 arranged to transfer signal pulses with ground isolation and without distortion to the succeeding device 14, even when the signal pulses have a long duration.

Figures 4A, 4B, 4C, 4D, 4E, 4F, 4G:
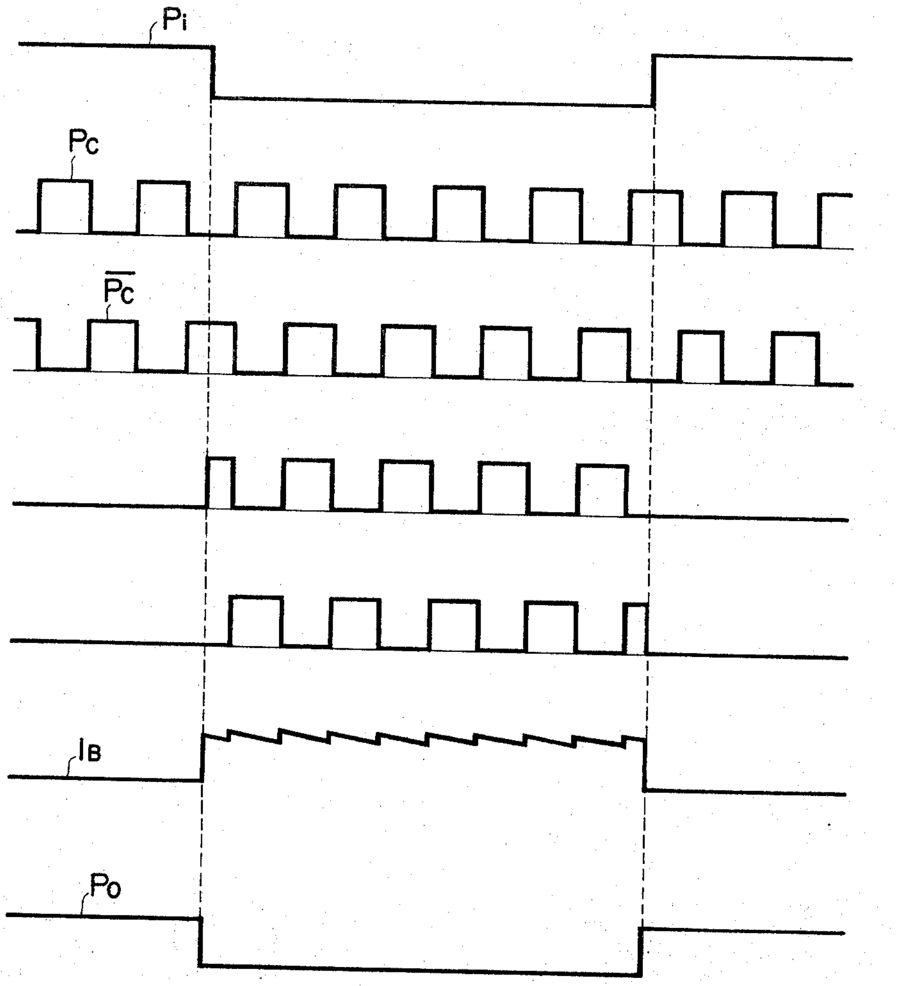
FIGS. 4A through 4G are illustrations of waveforms appearing in the circuit of FIG. 3.

The input to isolating circuit 40 is a pulse $P_i$ provided at the output of compensating circuit 26A and shown in FIG. 4A. Pulse $P_i$ is applied to the input of an inverter 42, the inverted output of which is applied to one input of coincidence gates 44 and 46, for example, NAND gates. Applied to the remaining inputs of gates 44 and 46 are opposite polarity synchronous clock pulses $P_c$ and $\overline{P_c}$ supplied by oscillator 48 (see FIGS. 4B and 4C). The outputs of gates 44 and 46, shown in FIGS. 4D and 4E, are pulse trains of opposite polarity which exist for the period of time determined by the inverted pulse at the output of inverter 42. The outputs of gates 44 and 46 are connected to the input terminals of the input winding of a pulse transformer 50. Accordingly, when the output of gate 44 is at a low level and the output of gate 46 is at a high level, a current flows in the winding direction indicated by arrow a; similarly, when gate 46 is at a high level and gate 44 is at a low level, current flows in the direction indicated by dotted arrow *b*.

The current flowing in the input winding of transformer 50 thus alternates at the frequency of the clock pulses $P_c$ and $\overline{P_c}$ and induces in the transformer output winding an alternating voltage waveform of the same frequency. A switching circuit 52 is provided to respond to this induced alternating voltage by maintaining itself in one output state for the duration of the alternating voltage, and in another output state when there is no induced alternating voltage. The switching circuit 52 as shown in FIG. 3 provides full wave rectification of the induced alternating voltage by means of a center tap 54 in the output winding of transformer 50, and diodes 56 and 58. In greater detail, when current flows in direction a in the transformer primary, a current I2 flows through diode 58; when current flows in the direction of dotted arrow b in the transformer input winding a current I1 flows through diode 56. The currents I1 and I2 are added at terminal 60 to form a rectified current Ib (FIG. 4F) which is applied to the base of an NPN transistor Q1 to cause it to switch to its conductive state. A stabilizing resistor R4 is connected between the transistor's base and emitter. The collector to emitter output $P_0$ (FIG. 4G), appears at terminals 62, 64, and is applied to the succeeding device 14.

Isolating circuit 40 controls distortion introduced in transformer 50 by limiting the extent to which waveform sag or decay can take place. By selecting a clock pulse $P_c$ whose frequency is sufficiently higher than that of the input pulse $P_i$ distortion introduced by transformer 50 can be neglected. As shown in FIG. 4F the rectified output of transformer 50, which is current $I_b$, has distortion corrected with every cycle of the clock pulse $P_c$ and consequently distortion cannot proceed to an extent affecting operating stability regardless of the width of the input pulse $P_i$.

Additional stability of the ground isolation circuit 100 shown in FIG. 3 is obtained by adjusting the parameters of capacitor C1, and resistors R1, R2, and R3 of compensating circuit 26A so that overcompensation of the type shown in FIG. 2D is produced to account for the additional distortion introduced by the following transformer 50. With this arrangement, and output pulse signal $P_0$ whose waveform is substantially perfectly compensated for distortion can be obtained at output terminals 62, 64, thus eliminating instabilities when pulse durations are extremely long.

It will be observed that omitting inverter 42 changes the polarity of output pulse $P_0$ and causes the entire ground isolation circuit 100 to function as an inverter. It will be observed also that the isolating circuit 40 can be used independently of transformer 20 and compensating circuit 26A, to operate directly on input pulses.

Figure 5:
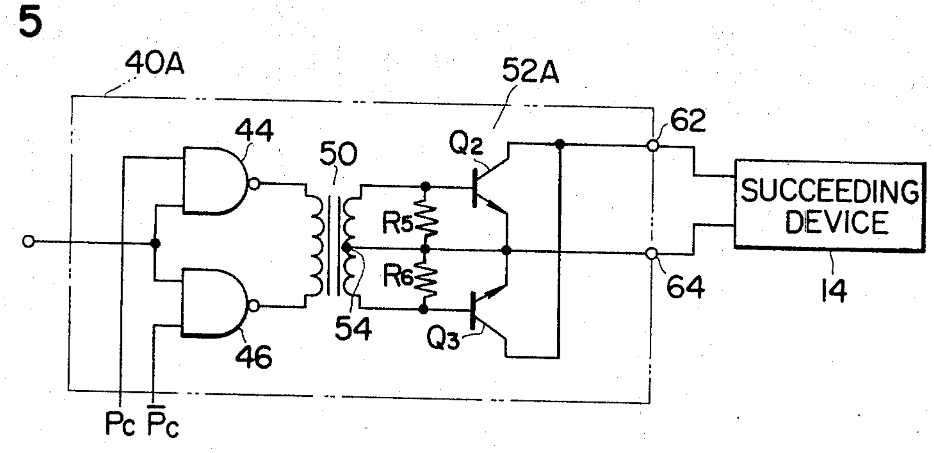
FIG. 5 is a schematic diagram of another modification of the invention.

FIG. 5 illustrates a modified isolation circuit 40A which omits inverter 42 and substitutes a modified switching circuit 52A. The modified switching circuit 52A arranges transistors $Q_2$ and $Q_3$ to simultaneously perform rectifying and switching functions. The transistor collectors are connected in common to output terminal 62 and the transistor emitters are connected in common to output terminal 64 and to transformer center tap 54. The transistor's bases are connected to respective end terminals of the transformer output winding. Stabilizing resistors R5 and R6 are connected between each transistor's base and emitter. It can be readily seen that the base to emitter junction of each transistor rectifies the signal applied to it and that the transistors $Q_2$ and $Q_3$ alternately conduct while there is an induced alternating voltage at the output winding of transformer 50, thereby providing an output waveform which faithfully reproduces the input waveform while maintaining ground isolation.

Although specific embodiments of the invention have been disclosed herein in detail, it is to be understood that this for the purpose of illustrating the invention, and should not be construed as limiting the scope of the invention, since it is apparent that many changes can be made to the disclosed structures by those skilled in the art to suit particular applications. For example, other suitable switching elements may be used instead of transistors.

We claim:

1. A ground isolation circuit for transferring signal pulses from a source device to a succeeding device with control of pulse waveform distortion, said circuit comprising:

a pulse transformer having an input winding for receiving signal pulses from said source device and an output winding across which pulse waveforms are induced, the output winding being isolated from the input winding, the pulse transformer distorting the signal pulses by introducing waveform sag in the induced pulse waveforms, and compensating means connected to receive the distorted pulse waveforms induced in said output winding and arranged to supply its output waveform to said succeeding device, said compensating means including amplifier means with a capacitive negative feedback circuit, the feedback circuit having its impedance parameters valued in relation to the sag-introducing impedance parameters of said pulse transformer to selectively compensate by means of feedback for the pulse waveform sag introduced by said pulse transformer, thereby to provide a compensated output waveform with controlled waveform distortion.

2. A ground isolation circuit for transferring signal pulses as claimed in claim 1 wherein said amplifier means is an operational amplifier and wherein said feedback circuit comprises a resistance and a capacitance in series having their impedance parameters matched with said transformer parameters to substantially fully compensate for pulse waveform sag introduced by said transformer.

3. A ground isolation circuit for transferring signal pulses as claimed in claim 1 wherein said amplifier means comprises an operational amplifier having its positive input terminal connected to the transformer output winding and its negative input terminal connected to the transformer output winding through a ground resistor R1, said feedback circuit including a series resistance R2 and capacitance C1 connected between the amplifier output terminal and its negative input terminal.

4. A ground isolation circuit for transferring signal pulses as claimed in claim 3 wherein the impedance parameters of said transformer define a time constant T1, and wherein the parameters of said compensation circuit are related thereto by the expression $T1 = C1(R1$ + $R2$), whereby the waveform sag introduced by said transformer is substantially fully compensated.

5. A ground isolation circuit for transferring signal pulses as claimed in claim 3 wherein the impedance parameters of said transformer define a time constant T1, and wherein the parameters of impedance of said compensating means are related thereto by the expression $T1 > C1 (R1 + R2)$, whereby the waveform sag introduced by said transformer is overcompensated.

6. A ground isolation circuit as claimed in claim 1 wherein said capacitive feedback circuit comprises impedances which are adjustable in value to adjust the compensation afforded by said compensating means.

7. A ground isolation circuit for transferring signal pulses as claimed in claim 6 wherein said feedback circuits include an adjustable resistance in parallel with a capacitance, thereby to permit the effective value of capacitance to be adjusted.

8. A ground isolation circuit for transferring signal pulses from a source device to a succeeding device with control of pulse waveform distortion, said circuit comprising:

a pulse transformer having an input winding for receiving signal pulses from said source device and an output winding across which pulse waveforms are induced, the output winding being isolated from the input winding, compensating means connected to receive the pulse waveforms induced in said output winding and arranged to supply its output waveform to said succeeding device, said compensating means including amplifier means with a capacitive negative feedback circuit, the feedback circuit having its impedance parameters valued in relation to the impedance parameters of said pulse transformer to selectively compensate by means of feedback for pulse waveform sag introduced by said pulse transformer, thereby to provide a compensated output waveform with controlled waveform distortion, and an isolating circuit connected between the output of said compensating means and said succeeding device, said isolating circuit comprising:

coincidence gate means gated through one input by the output waveform of said compensating means, oscillator means supplying a clock pulse to the other input of said gate means, a pulse transformer having its input winding connected to the output of said gate means, whereby said input winding receives an alternating signal for the duration of each of said signal pulses, said transformer having an isolated output winding across which a corresponding alternating waveform is induced, and switching means maintained in a preselected state by said induced alternating waveform, the output of said switching means being applied to said succeeding device, whereby said induced alternating waveform is substantially uniform in magnitude for the duration of each of said signal pulses to reliably control said switching means to provide a substantially distortionless output waveform.

9. A ground isolation circuit for transferring signal pulses as claimed in claim 8 wherein said compensating means has its impedance parameters valued in relation to the impedance parameters of its pulse transformer so as to overcompensate for the sag introduced by its pulse transformer.

10. A ground isolation circuit for transferring pulses as claimed in claim 8 wherein said coincidence gate means comprises a pair of coincidence gates each receiving at one input the output waveform of said compensating means, said oscillator means comprising means for providing synchronous clock pulses of opposite polarity applied respectively to the remaining inputs of said pair of coincidence gates, said pulse transformer input winding being connected between the outputs of said pair of coincidence gates.

11. A ground isolation circuit for transferring pulses as claimed in claim 8 wherein said switching means comprises means for rectifying the induced alternating waveform at the output winding of the pulse transformer and for switching an output state according to said rectified waveform.

12. A ground isolation circuit for transferring pulses as claimed in claim 11 wherein said rectifying and state-switching means comprises diodes arranged to provide full wave rectification of said induced alternating signal, and a switching element responsive to said rectified signal.

13. A ground isolation circuit as claimed in claim 11 wherein said rectifying and state-switching means comprises a pair of parallel transistors arranged to conduct during alternate half cycles of said induced alternating waveform, the transistor outputs being superimposed to provide an output waveform to be supplied to said succeeding device.

14. A ground isolation circuit as claimed in claim 8 further comprising inverter means in advance of said coincidence gate means.

15. An isolating circuit for transferring signal pulses from a source device to a succeeding device with control of pulse waveform distortion, comprising:

coincidence gate means comprising a pair of coincidence gates each receiving at one input the signal pulse waveform, oscillator means comprising means for supplying synchronous clock pulses of opposite polarity respectively to another input of each of said gates, a pulse transformer having its input winding connected between the outputs of said pair of coincidence gates, whereby said input winding receives superimposed alternating signals of opposite polarity for the duration of each of said signal pulses, said transformer having an isolated output winding across which a corresponding alternating waveform is induced, and switching means maintained in a preselected state by said induced alternating waveform, the output of said switching means being applied to said succeeding device, whereby said induced alternating waveform is substantially uniform in magnitude for the duration of each of said signal pulses to reliably control said switching means to provide a substantially distortionless output waveform.

16. An isolating circuit for transferring pulses as claimed in claim 15 wherein said switching means comprises means for rectifying the induced alternating waveform at the output winding of the pulse transformer and for switching an output state according to said rectified waveform.

17. An isolating circuit for transferring pulses as claimed in claim 16 wherein said rectifying and state-switching means comprises diodes arranged to provide full wave rectification of said induced alternating signal, and a switching element responsive to said rectified signal.

18. An isolating circuit as claimed in claim 16 wherein said rectifying and state-switching means comprises a pair of parallel transistors arranged to conduct during alternate half cycles of said induced alternating waveform, the transistor outputs being superimposed to provide an output waveform to be supplied to said succeeding device.

19. An isolating circuit as claimed in claim 15 further comprising inverter means in advance of said coincidence gate means.

* * * * *